(12) United States Patent
Mikan, Jr. et al.

(10) Patent No.: US 7,660,150 B2
(45) Date of Patent: Feb. 9, 2010

(54) MEMORY CELL HAVING IMPROVED WRITE STABILITY

(75) Inventors: Donald George Mikan, Jr., Austin, TX (US); Hugh Mair, Fairview, TX (US)

(73) Assignee: Texas Instruments Incorporated, Dallas, TX (US)

(*) Notice: Subject to any disclaimer, the term of this patent is extended or adjusted under 35 U.S.C. 154(b) by 47 days.

(21) Appl. No.: 11/967,472

(22) Filed: Dec. 31, 2007

(65) Prior Publication Data

US 2009/0168496 A1 Jul. 2, 2009

(51) Int. Cl.
*G11C 11/40* (2006.01)
(52) U.S. Cl. .................... 365/154; 365/230.05
(58) Field of Classification Search .............. 365/155
See application file for complete search history.

(56) References Cited

U.S. PATENT DOCUMENTS

| | | | |
|---|---|---|---|
| 7,106,620 B2 * | 9/2006 | Chang et al. | 365/154 |
| 7,400,523 B2 * | 7/2008 | Houston | 365/154 |
| 7,440,313 B2 * | 10/2008 | Abein et al. | 365/154 |
| 2008/0192527 A1 * | 8/2008 | Yabe | 365/63 |

\* cited by examiner

*Primary Examiner*—Tan T. Nguyen
(74) *Attorney, Agent, or Firm*—Ronald O. Neerings; Wade James Brady, III; Frederick J. Telecky, Jr.

(57) ABSTRACT

A method is provided for writing to a memory cell having a read access circuit that is separate and isolatable from a write access circuit. The method comprises providing a logic state to be written to the memory cell onto a write bit line coupled to the memory cell through the write access circuit, changing a write word line that controls the write access circuit from a deactivated low voltage state to an activated high voltage state, and changing a read word line that controls the read access circuit from an activated low voltage state to a deactivated high voltage state, wherein the change in voltage on the read word line provides a voltage boost to the voltage on the write word line caused by the electrical coupling between the read word line and the write word line to provide write assist to the memory cell during a write operation.

20 Claims, 3 Drawing Sheets

MEMORY CELL HAVING IMPROVED WRITE STABILITY

FIELD OF THE INVENTION

The present invention relates generally to memory devices, and more particularly relates to a static memory cell architecture having improved stability during a write operation.

BACKGROUND OF THE INVENTION

As integrated circuit technologies are scaled, stability in a static memory cell becomes a major concern affecting the design of reliable memory arrays, including, for example, static random access memory (SRAM) arrays. Most static memory cells employ a conventional six-transistor (6-T) architecture. While this memory cell arrangement offers a compact structure, the 6-T memory cell has many disadvantages, particularly its potential inability to scale with overall technology advancements due, at least in part, to stability problems which are often exacerbated as integrated circuit process dimensions shrink. Stability problems generally arise whenever stored voltages on internal nodes of the memory cell are disturbed. As process technologies scale, process-induced variations, as well as fundamental variation sources (e.g., dopant fluctuation effect on threshold voltage, etc.), may result in large threshold voltage variations across a given wafer. This threshold voltage scatter effect essentially magnifies the disturb voltage in 6-T memory cells, which can lead to stability failures in the SRAM array in which the 6-T memory cells are employed.

A recent trend is to employ an eight-transistor (8-T) architecture as illustrated in FIG. 1. The 8-T memory cell 10 is a read assist mechanism that advantageously eliminates disturbs in the memory cell during a read operation. The exemplary 8-T memory cell 10 comprises a static storage element 12 which is selectively connectable to first and second write bit lines (WBL) 14 and 16 via first and second N-channel metal-oxide semiconductor (NMOS) write access transistors 18 and 20, such that a source terminal of transistor 18 is connected to write bit line 14, and a drain terminal of transistor 18 is connected to a first internal node N1 of the storage element 12 and a source terminal of transistor 20 is connected to write bit line 16, and a drain terminal of transistor 20 is connected to a second internal node N2 of the storage element 12. Gate terminals of write access transistors 18 and 20 are connected to a corresponding write word line (WWL) 22 for conveying a write signal. The write access transistors 18 and 20 function to selectively connect the storage element 12 to the write bit lines 14 and 16 in response to the write signal. The static storage element 12 comprises first and second inverters 24 and 26, respectively, configured such that an output of the first inverter 24 is connected to an input of the second inverter 26 at node N2, and an output of the second inverter 26 is connected to an input of the first inverter 24 at node N1.

In order to eliminate read disturbs of the memory cell 10 during the read operation, the memory cell 10 includes a separate read access circuit 28 connected to a corresponding read bit line (RBL) 30 and read word line (RWL) 32 for selectively activating the read access circuit 28. The read access circuit 28 comprises first and second NMOS transistors 34 and 36, respectively, connected in a stacked arrangement. Specifically, a drain terminal of first NMOS transistor 34 is connected to the read bit line 30, a source terminal of the first NMOS transistor 34 is connected to a drain terminal of the second NMOS transistor 36, and a source terminal of the second NMOS transistor 36 is connected to ground. A gate terminal of the first NMOS transistor 34 is connected to the read word line 32 and forms a first input of the read circuit 28, and a gate terminal of the second NMOS transistor 36 is connected to internal node N2 of the storage element 12 and forms a second input of the read access circuit 28.

When reading memory cell 10, an active read signal (e.g., VDD) is applied to the corresponding read word line 32, thereby turning on NMOS transistor 34 in the read access circuit 28. Furthermore, the read bit line 30 is precharged to a high voltage state. When a logical "1" is stored at node N2, NMOS transistor 36 in the read access circuit 28 is turned on, thereby creating an electrical path and allowing current to flow from the read bit line 30 through the read access circuit 28, when the corresponding read bit line 30 is raised above ground potential, between the read bit line 30 and ground through NMOS transistors 34 and 36. However, when a logical "0" is stored at node N2, transistor 36 is turned off and thus the electrical path between read bit line 30 and ground is effectively broken, thereby preventing current from flowing between the read bit line and ground. A sense amplifier, or alternative sensing circuitry, connected to the read bit line 30 is preferably operative to detect a voltage and/or current difference on the read bit line and to equate this difference with the logical state of the memory cell 10.

During the read operation, write access transistors 18 and 20, which are enabled during the write operation, are disabled, such as, for example, by applying a logical "0" to the corresponding write word line 22. Disabling write access transistors 18 and 20 during the read operation serves to electrically isolate the static storage element 12 from the corresponding write bit lines 14 and 16. Furthermore, since the gate terminal of transistor 36, which is connected to node N2 of the storage element 12, has a substantially high impedance, the internal node N2 is essentially electrically isolated from the read bit line 30 during both the read and write operations. The 8-T memory cell 10 provides a mechanism for reading the memory cell which is beneficially decoupled from the mechanism used to write the memory cell. However, as a demand for lower power applications increases, the 8-T memory cell becomes increasingly difficult to write to employing lower voltages.

SUMMARY OF THE INVENTION

In one aspect of the invention, a memory array is provided having a memory cell coupled to a read word line and a write word line of the memory array. The memory cell comprises a storage element for storing a logical state of the memory cell and a write access circuit configured to connect the storage element to at least a first write bit line in the memory array in response to an activated high voltage state on the write word line for writing the logical state to the memory cell and configured to disconnect the storage element from the at least first write bit line in a deactivated low voltage state on the write word line. The memory cell further comprises a read access circuit including an input node connected to the storage element and an output node connected to a read bit line of the memory array, the read circuit being enabled and configured to read the logic state of the storage element in response to an activated low voltage state on the read word line and disabled and disconnected from the storage element in response to a deactivated high voltage state on the read word line. The memory array is configured, during a write operation to the storage element, to change the state of the write word line from a deactivated low voltage state to an activated high voltage state and subsequently change the state of the read word line from an activated low voltage state to a deactivated high voltage state to provide a voltage boost from the read word line to the voltage on the write word line caused by the electrical coupling between the read word line and the write word line.

In another aspect of the present invention, a memory array is provided having a plurality of memory cells each being connected to a read word line and a write word line. Each memory cell comprises a storage element for storing a logical state of the memory cell and a write access circuit configured to connect the storage element to at least a first write bit line in the memory array in response to an activated high voltage state on the write word line for writing the logical state to the memory cell and disconnect the storage element from the at least first write bit line in a deactivated low voltage state on the write word line. Each memory cell further comprises a read access circuit comprising first and second P-channel metal-oxide semiconductor (PMOS) transistors configured in a stacked configuration, a source terminal of the first PMOS transistor being connect to a reference source, a drain terminal of the first PMOS transistor being connected to a source terminal of the second PMOS transistor, a drain terminal of the second PMOS transistor being connected to a read bit line, a gate terminal of the first PMOS transistor being connected to the storage element, and a gate terminal of the second PMOS transistor being connected to the read word line, the read access circuit being enabled and configured to read the logic state of the storage element in response to an activated low voltage state on the read word line and being configured to be disabled and disconnected from the storage element in response to a deactivated high voltage state on the read word line. The memory array is configured, during a write operation to the storage element, change the state of the write word line from a deactivated low voltage state to an activated high voltage state and subsequently change the state of the read word line from an activated low voltage state to a deactivated high voltage state to provide a voltage boost from the read word line to the voltage on the write word line caused by the electrical coupling between the read word line and the write word line.

In yet another aspect of the invention, a method is provided for writing to a memory cell having a read access circuit that is separate and isolatable from a write access circuit. The method comprises providing a logic state to be written to the memory cell onto a write bit line coupled to the memory cell through the write access circuit, changing a write word line that controls the write access circuit from a deactivated low voltage state to an activated high voltage state, and changing a read word line that controls the read access circuit from an activated low voltage state to a deactivated high voltage state, wherein the change in voltage on the read word line provides a voltage boost to the voltage on the write word line caused by the electrical coupling between the read word line and the write word line to provide write assist to the memory cell during a write operation.

DETAILED DESCRIPTION OF THE INVENTION

The present invention will be described herein in the context of an illustrative static memory cell suitable for use, for example, in an SRAM array. It should be appreciated that the invention is not limited to this or any particular memory cell architecture. Rather, the invention is more generally applicable to techniques for advantageously providing write assists in a memory cell, thereby improving a stability of the memory cell, during a write operation. Although the present invention will be illustrated with respect to an 8-T memory cell, it is to be appreciated that the present invention is also applicable to a 7-T memory cell (i.e., having only one write access transistor) or any number of transistor memory cell configurations that include a separate read access circuit that is isolatable from a separate write access circuit of the memory cell and includes electrically coupled read word lines and write word lines.

In accordance with an aspect of the invention, the memory cell includes a read access circuit configured to be activated to read the memory cell with a read word line in an active low voltage state, and configured to be deactivated and provide write assist during a change of the read word line from the active low voltage state to a deactivated high voltage state. The memory cell includes a write access circuit configured to be activated to write to the memory cell with a write word line in an active high voltage state and configured to be deactivated with the write word line in a deactivated low voltage state. A low voltage state can be, for example, 0 volts, while a high voltage state can be, for example, VDD. Furthermore, the read word line and write word line are electrically coupled to one another. During a write operation, the write word line changes from a deactivated low voltage state to an activated high voltage state activating the write access circuit. The read word line then changes from an active low voltage state to a deactivated high voltage state deactivating the read access circuit and providing a voltage boost from the read word line to the write word line caused by the electrical coupling between the read word line and the write word line and thus providing a write assist to the memory cell during the write operation.

Figure 2:
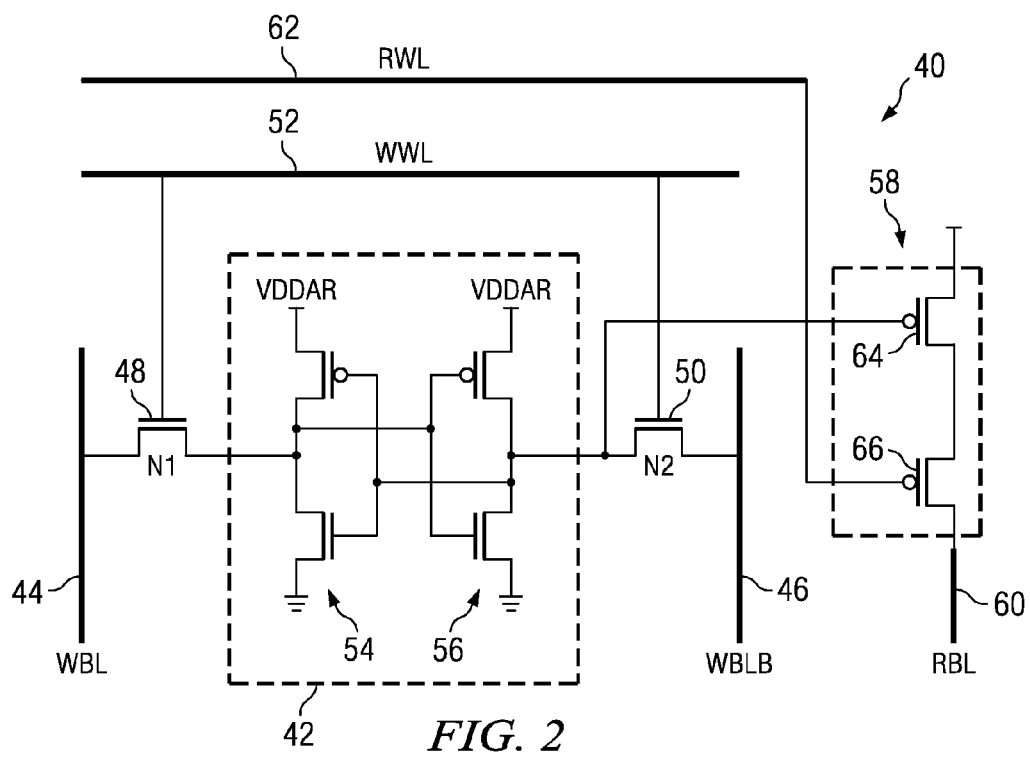
FIG. 2 is a schematic diagram illustrating an exemplary eight-transistor static memory cell in accordance with an aspect of the present invention.

FIG. 2 illustrates an 8-T memory cell 40 configured to provide write assist in accordance with an aspect of the present invention. The 8-T memory cell 40 includes a static storage element 42 which is selectively connectable to first and second write bit lines (WBL) 44 and 46 via first and second N-channel metal-oxide semiconductor (NMOS) write access transistors 48 and 50, such that a source terminal of transistor 48 is connected to write bit line 44, and a drain terminal of transistor 48 is connected to a first internal node N1 of the storage element 42 and a source terminal of transistor 50 is connected to write bit line 46, and a drain terminal of transistor 50 is connected to a second internal node N2 of the storage element 42. Gate terminals of write access transistors 48 and 50 are connected to a corresponding write word line (WWL) 52 for conveying a write signal. The write access transistors 48 and 50 function to selectively connect the storage element 42 to the write bit lines 44 and 46 in response to the write signal. The static storage element 42 comprises first and second inverters 54 and 56, respectively, configured such that an output of the first inverter 54 is connected to an input of the second inverter 56 at node N2, and an output of the second inverter 56 is connected to an input of the first inverter 54 at node N1.

Figure 1:
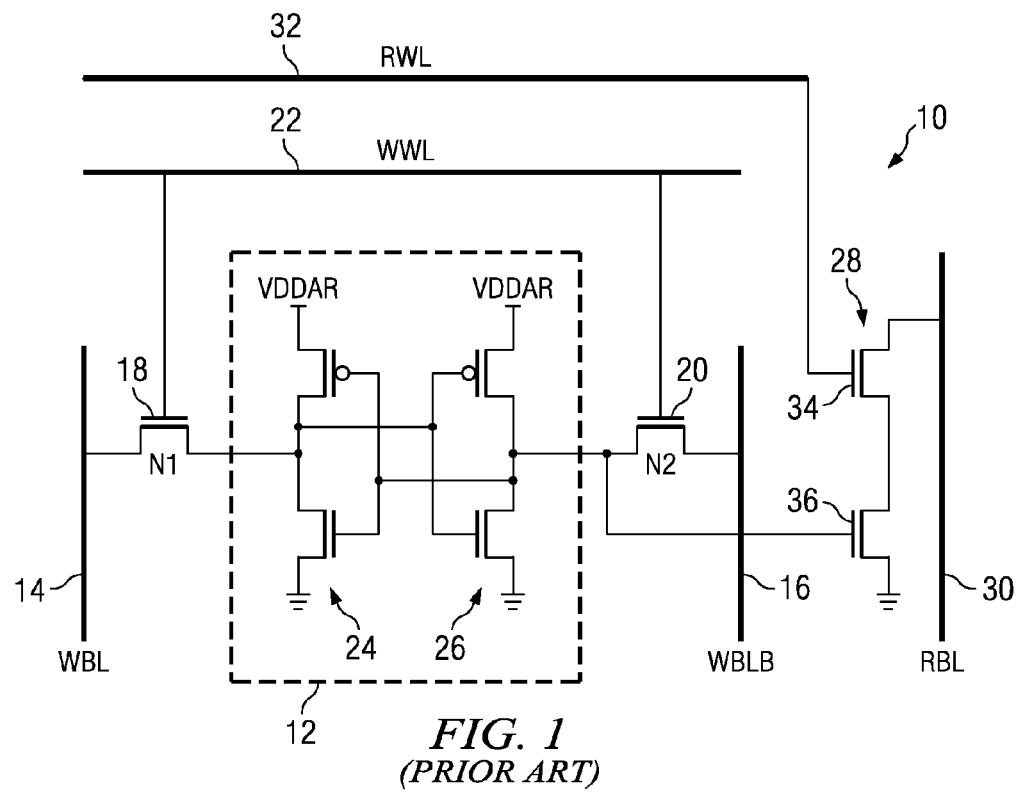
FIG. 1 is a schematic diagram illustrating a conventional eight-transistor static memory cell.

In order to eliminate read disturbs of the memory cell 40 during the read operation, the memory cell 40 includes a separate read access circuit 58 connected to a corresponding read bit line (RBL) 60 and read word line (RWL) 62 for selectively activating the read access circuit 58. However, to also provide write assist to the memory cell 40, the read circuit 58 comprises first and second P-channel metal-oxide semiconductor (PMOS) transistors 64 and 66, respectively, connected in a stacked arrangement. Specifically, a source terminal of first transistor 64 is connected to a reference source (e.g., VDD), a drain terminal of the first transistor 64 is connected to a source terminal of the second transistor 66, and a drain terminal of the second transistor 66 is connected to a read bit line 60. A gate terminal of the second transistor 66 is connected to the read word line 62 and forms a first input of the read access circuit 58, and a gate terminal of the first transistor 64 is connected to internal node N2 of the storage element 42 and forms a second input of the read access circuit 58. Furthermore, the read bit line 60 is precharged to a low voltage state as opposed to a high voltage state as previously illustrated in the prior art memory cell of FIG. 1.

When reading memory cell 40, an active read signal (e.g., 0 volts) is applied to the corresponding read word line 62, thereby turning on PMOS transistor 66 in the read circuit 58. When a logical "0" is stored at node N2, PMOS transistor 64 in the read access circuit 58 is turned on, thereby creating an electrical path and allowing current to flow from reference source through the read circuit 58 to the read bit line 60 and provide a high state at the read bit line. However, when a logical "1" is stored at node N2, PMOS transistor 66 is turned off and thus the electrical path between the reference source and the read bit line 60 is effectively broken, thereby preventing current from flowing between the reference source and read bit line 60, and keeping the read bit line at its precharged low state. Therefore, the output of the read access circuit 58 on the read bit line 60 is in an inverted logic state from the actual logic state of the storage element 42. A sense amplifier, or alternative sensing circuitry, connected to the read bit line 60 is preferably operative to detect a voltage and/or current difference on the read bit line and to equate this difference with the logical state of the memory cell 40.

During the write operation, write access transistors 48 and 50, which are disabled during the read operation, are enabled, such as by applying a logical "1" to the corresponding write word line 52. Subsequently, the read word line 62 then changes from an active low voltage state to a deactivated high voltage state deactivating the read access circuit 58 and providing a voltage boost from the read word line 62 to the write word line 52 due to the electrical coupling between the read word line 62 and the write word line 52 and thus providing a write assist to the memory cell 40 during the write operation.

Figure 3:
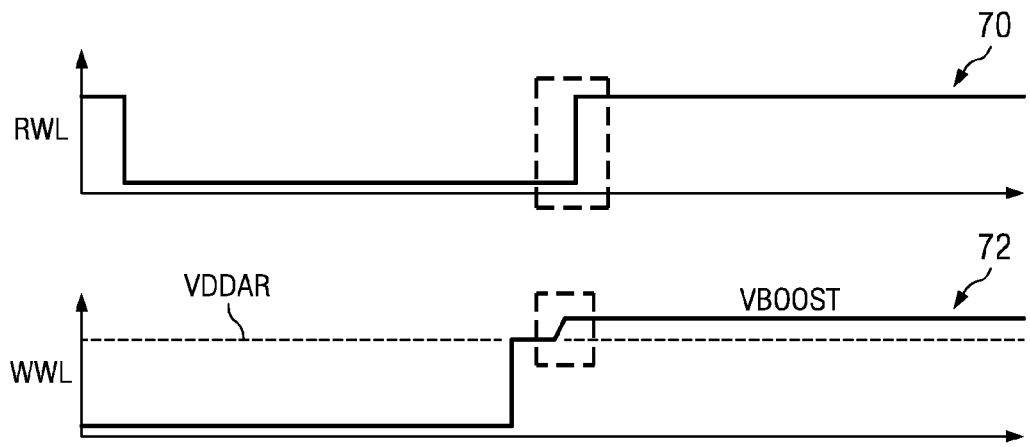
FIG. 3 illustrates a timing diagram of a read word line and a timing diagram of a write word line during a write operation in accordance with an aspect of the present invention.

FIG. 3 illustrates a timing diagram 70 of the read word line 62 and a timing diagram 72 of the write word line 52 during a write operation in accordance with an aspect of the present invention. The write word line 52 changes from a deactivated low voltage state to an activated high voltage state. Subsequently (e.g., picoseconds later), the read word line 62 changes from an active low voltage state to a deactivated high voltage state causing the normal write voltage (VDDAR) on the write word line 52 to be boosted by the read word line 62 due to the electrical coupling between the read word line 62 and the write word line 52 to a boosted write voltage (VBOOST). The electrical coupling can occur, for example, by the read word line 62 residing adjacent to the write word line 52.

Figure 4:
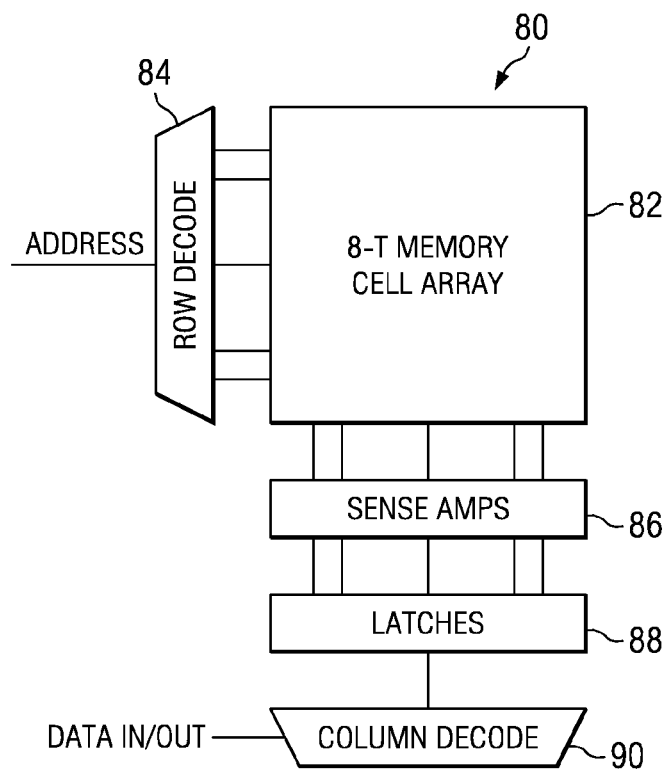
FIG. 4 is a block diagram depicting an 8-T SRAM memory array with write assist in accordance with an aspect of the invention.

FIG. 4 is a block diagram depicting an 8-T SRAM memory array 80 with write assist in accordance with an aspect of the invention. The memory array 80 can be formed as an integrated circuit. The memory array 80 includes an 8-T memory cell array 82, row decode circuitry 84 coupled to the memory cells of the 8-T memory cell array 82 via at least one corresponding write word line and at least one corresponding read word line, a plurality of sense amps 86, latches 88 and column decode circuitry 90 connected to the memory cells via at least one write bit line and at least one read bit line. The plurality of sense amplifiers 90 can be single ended or differential based on a particular application. The sense amplifiers 90 are configured to precharge the read bit lines to a logic low state. The read access circuits of each 8-T memory cell are configured to activate with the read word line in a logic low state and deactivate with the read word line in a logic high state, such that a given read word line can be employed to boost the voltage of a given write word line during a write operation as previously discussed in FIG. 2-3.

Figure 5:
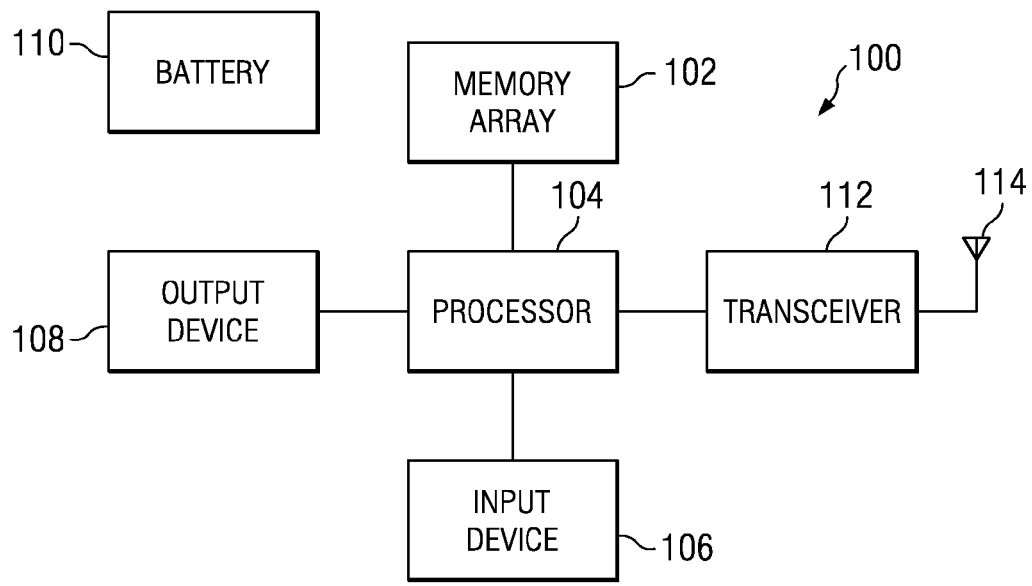
FIG. 5 illustrates a portable electronic device employing a memory array with write assist in accordance with an aspect of the present invention.

It is to be appreciated that a memory array 80 with write assist can be employed in a variety of different applications. FIG. 5 illustrates a portable electronic device 100 employing a memory array 102 with write assist in accordance with an aspect of the present invention. The portable electronic device 100 includes a processor 102 coupled to the memory array 102, an input device 106 (e.g., keyboard, keypad, touch screen) and an output device 108 (e.g., display, printer, peripheral device) both coupled to the processor 104 and a battery 110 for powering the components of the portable electronic device 100. The portable electronic device may include a transceiver 112 and an antenna 114 for wireless transmission with one or more other devices.

Figure 6:
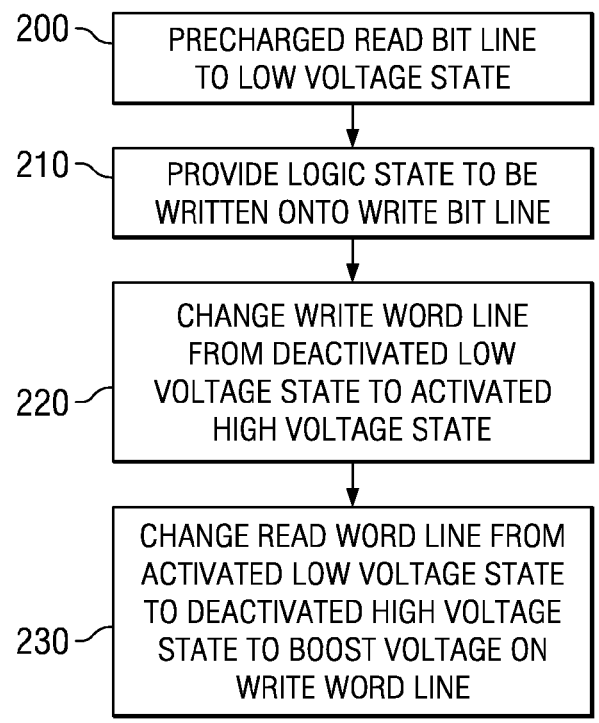
FIG. 6 illustrates a methodology for writing to a memory cell having a separate read access circuit selectively isolatable from a separate write access circuit in accordance with an aspect of the present invention.

In view of the foregoing structural and functional features described above, a method will be better appreciated with reference to FIG. 6. It is to be understood and appreciated that the illustrated actions, in other embodiments, may occur in different orders and/or concurrently with other actions. Moreover, not all illustrated features may be required to implement a method.

FIG. 6 illustrates a methodology for writing to a memory cell having a separate read access circuit selectively isolatable from a separate write access circuit in accordance with an aspect of the present invention. At 200, a read bit line of the memory cell is precharged to a low voltage state. At 210, the logic state to be written to the memory cell is provided on a write bit line. At 220, a write word line of the memory cell is changed from a deactivated low voltage state to an active high voltage state. At 230, a read word line of the memory cell is changed from an activated low voltage state to a deactivated high voltage state to boost the voltage on the write word line and to provide write assist during the write operation.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations.

What is claimed is:

1. A memory array having a memory cell coupled to a read word line and a write word line of the memory array, the memory cell comprising:
- a storage element for storing a logical state of the memory cell;
- a write access circuit configured to connect the storage element to at least a first write bit line in the memory array in response to an activated high voltage state on the write word line for writing the logical state to the memory cell and configured to disconnect the storage element from the at least first write bit line in a deactivated low voltage state on the write word line;
- a read access circuit including an input node connected to the storage element and an output node connected to a read bit line of the memory array, the read circuit being enabled and configured to read the logic state of the storage element in response to an activated low voltage state on the read word line and disabled and disconnected from the storage element in response to a deactivated high voltage state on the read word line; and
- wherein the memory array is configured, during a write operation to the storage element, to change the state of the write word line from a deactivated low voltage state to an activated high voltage state and subsequently change the state of the read word line from an activated low voltage state to a deactivated high voltage state to provide a voltage boost from the read word line to the voltage on the write word line caused by the electrical coupling between the read word line and the write word line.

2. The memory array of claim 1, wherein the read access circuit comprises first and second P-channel metal-oxide semiconductor (PMOS) transistors in a stacked configuration, a source terminal of the first PMOS transistor being connect to a reference source, a drain terminal of the first PMOS transistor being connected to a source terminal of the second PMOS transistor, a drain terminal of the second PMOS transistor being connected to the read bit line, a gate terminal of the first PMOS transistor being connected to the storage element, and a gate terminal of the second PMOS transistor being connected to the read word line.

3. The memory array of claim 1, wherein the memory cell is one of an eight transistor (8-T) memory cell and a seven transistor (7-T) memory cell.

4. The memory array of claim 1, wherein the read bit line is precharged to a low voltage state.

5. The memory array of claim 1, wherein the write access circuit comprises a first transistor, a first source/drain terminal of the first transistor being connected to the storage element, a second source/drain terminal of the first transistor being connectable to the first write bit line, and a gate terminal of the first transistor being connected to the write word line.

6. The memory array of claim 5, wherein the first transistor comprises an N-channel metal-oxide semiconductor (NMOS) device.

7. The memory array of claim 1, wherein the storage element comprises first and second inverters, an output of the first inverter being connected to an input of the second inverter, and an input of the first inverter being connected to an output of the second inverter.

8. A portable electronic device comprising the memory array of claim 1 and further comprising:
- a processor coupled to the memory array;
- an input device coupled to the processor;
- an output device coupled to the processor; and
- a battery configured to provide power to at least one of the processor, the input device, the output device and the memory array.

9. The portable electronic device of claim 8, further comprising:
- a transceiver coupled to the processor; and
- an antenna coupled to the transceiver.

10. The memory array of claim 1, further comprising at least one single ended or differential sense amplifier coupled to the read bit line to determine a logic state of the memory cell during a read operation.

11. A memory array having a plurality of memory cells each being connected to a read word line and a write word line, each memory cell comprising:
- a storage element for storing a logical state of the memory cell;
- a write access circuit configured to connect the storage element to at least a first write bit line in the memory array in response to an activated high voltage state on the write word line for writing the logical state to the memory cell and disconnect the storage element from the at least first write bit line in a deactivated low voltage state on the write word line;
- a read access circuit comprising first and second P-channel metal-oxide semiconductor (PMOS) transistors configured in a stacked configuration, a source terminal of the first PMOS transistor being connect to a reference source, a drain terminal of the first PMOS transistor being connected to a source terminal of the second PMOS transistor, a drain terminal of the second PMOS transistor being connected to a read bit line, a gate terminal of the first PMOS transistor being connected to the storage element, and a gate terminal of the second PMOS transistor being connected to the read word line, the read access circuit being enabled and configured to read the logic state of the storage element in response to an activated low voltage state on the read word line and being configured to be disabled and disconnected from the storage element in response to a deactivated high voltage state on the read word line; and
- wherein the memory array is configured, during a write operation to the storage element, to change the state of the write word line from a deactivated low voltage state to an activated high voltage state and subsequently change the state of the read word line from an activated low voltage state to a deactivated high voltage state to provide a voltage boost from the read word line to the voltage on the write word line caused by the electrical coupling between the read word line and the write word line.

12. The memory array of claim 11, wherein each of the memory cells are one of an eight transistor (8-T) memory cell and a seven transistor (7-T) memory cell.

13. The memory array of claim 11, wherein the read bit line is precharged to a low voltage state by at least one single ended or differential sense amp coupled to the read bit line, the at least one single ended or differential sense amplifier being configured to determine a logic state of the memory cell during a read operation.

14. The memory array of claim 11, wherein the write access circuit comprises a first N-channel metal-oxide semiconductor (NMOS) transistor, a first source/drain terminal of the first NMOS transistor being connected to the storage element, a second source/drain terminal of the first NMOS transistor being connected to the first write bit line, and a gate terminal of the first NMOS transistor being connected to the write word line.

15. A portable electronic device comprising the memory array of claim 1 and further comprising:
   a processor coupled to the memory array;
   an input device coupled to the processor;
   an output device coupled to the processor; and
   a battery configured to provide power to at least one of the processor, the input device, the output device and the memory array.

16. The portable electronic device of claim 15, further comprising:
   a transceiver coupled to the processor; and
   an antenna coupled to the transceiver.

17. An integrated circuit comprising the memory array of claim 11.

18. A method of writing to a memory cell having a read access circuit that is separate and isolatable from a write access circuit, the method comprising:
   providing a logic state to be written to the memory cell onto a write bit line coupled to the memory cell through the write access circuit;
   changing a write word line that controls the write access circuit from a deactivated low voltage state to an activated high voltage state; and
   changing a read word line that controls the read access circuit from an activated low voltage state to a deactivated high voltage state, wherein the change in voltage on the read word line provides a voltage boost to the voltage on the write word line caused by the electrical coupling between the read word line and the write word line to provide write assist to the memory cell during a write operation.

19. The method of claim 18, further comprising precharging a read bit line coupled to the read access circuit to a low voltage state.

20. The method of claim 18, further comprising performing a read operation wherein the output of the read access circuit on the read bit line is in an inverted logic state from the actual logic state of the memory cell.

* * * * *